United States Patent [19]

St. Cyr

[11] 4,398,117
[45] Aug. 9, 1983

[54] BELLOWS SUPPORT FOR SURFACE ACOUSTIC WAVE DEVICE

[75] Inventor: Raymond A. St. Cyr, Salem, Mass.

[73] Assignee: Sperry Corporation, New York, N.Y.

[21] Appl. No.: 246,464

[22] Filed: Mar. 23, 1981

[51] Int. Cl.³ ............................................. H01L 41/08
[52] U.S. Cl. .................... 310/348; 310/346; 310/313 R; 333/155
[58] Field of Search .................. 310/348, 346, 313 R, 310/313 A, 313 B; 333/150, 155

[56] References Cited

U.S. PATENT DOCUMENTS 3,437,849 4/1969 Treatch et al. ................. 310/346 X
3,732,446 5/1973 Bryant ............................. 310/348 X
3,916,348 10/1975 Toda et al. ...................... 310/346 X
4,213,104 7/1980 Cullen et al. ......................... 310/346

FOREIGN PATENT DOCUMENTS 657593 4/1979 U.S.S.R. .............................. 310/348

Primary Examiner—Mark O. Budd
Attorney, Agent, or Firm—Howard P. Terry

[57] ABSTRACT

An improved surface acoustic wave device having an acoustic substrate is mounted on multidirectional deflection structures that provide isolation from shocks and vibration and permit thermal expansion without stress to the acoustic substrate.

14 Claims, 5 Drawing Figures

BELLOWS SUPPORT FOR SURFACE ACOUSTIC WAVE DEVICE

BACKGROUND OF THE INVENTION

1. Field of the Invention

This invention pertains to surface acoustic wave devices and more particularly relates to an improved surface acoustic wave device wherein the improvement comprises a means for mounting the acoustic substrate to provide vibration and shock isolation and to permit thermal expansions and contractions of the acoustic substrate without creating stresses or strains therein.

2. Description of the Prior Art

Surface acoustic wave (SAW) devices must meet full operational performance requirements during and after the acceleration, impact, shock and vibration conditions that occur in spacecraft, projectile, and missile environments. Furthermore, the differing thermal expansion characteristics of the acoustic substrate and the base on which it is mounted must be allowed for; otherwise stresses may develop in the acoustic substrate that may lead to a deterioration of performance and device failure. Mounting structures well known in the art have been used with varying degrees of success as the most cost effective method of minimizing both thermally and mechanically induced stresses. The reliability of surface acoustic wave devices, particularly in hostile environments is therefore directly dependent on the mounting structure utilized.

It is also important to use mounting techniques which do not contaminate the surface of the SAW device. Contaminants on the surface of the acoustic substrate may result in a mass loading effect which alters the frequency of the device, causing device aging.

One mounting technique known in the art comprises gluing the acoustic substrate directly to a base or header. A variation of this method employs flexible epoxy or flexible epoxy impregnated cloth tape to mount the acoustic substrate to the base. Unlike the first method, this latter method allows for thermal expansion. The high outgassing of flexible expoxies, however, may contaminate the acoustic substrate resulting in increased aging effects. Another mounting method known in the art is a cantilevered scheme comprising bonding the acoustic substrate on one end only to, for example, a TO-8 type header base, with a hold down clearance clamp over the opposite end to dampen vibrations. This method also allows for temperature changes. These methods, however, do not provide sufficient shock and vibration isolation for reliable operation under exposure to severe mechanical transients.

Two mounting techniques known by workers in the bulk mode crystal resonator field, and adopted for use with SAW devices are shown in FIGS. 1 and 1A. FIG. 1 shows a C-clip 10 mounted to a SAW acoustic substrate 11 and base 30 using epoxy resin 12 as an adhesive. These C-clips are typically manufactured from gold ribbon and electroplated with nickel. In FIG. 1A, a mounting clip known in the art as an L-clip 13 is shown attached to SAW substrate 11 using epoxy resin 12.

C-clips and L-clips are however, primarily flexible in only one direction, as shown by arrow 14 in FIGS. 1 and 1A. Shocks in other directions will be transmitted to the acoustic substrate causing stresses therein, and may also deform the clips. As the deformation in the clips is relaxed, additional stresses are created in the acoustic substrate.

Important requirements for a high shock mounting structure are that it not apply undue stress to the acoustic substrate and that it be strong enough not to permanently deform under the loading experienced during shock. The C and L-clip mounted SAW devices are known to have mounting stresses which increase device aging. A stress free mount will serve to reduce these effects.

The present invention provides a simple method for mounting the acoustic substrate of surface acoustic wave devices to minimize the effects of shock and vibration, and permit thermal expansions and contractions without causing undue stress which leads to unreliable operation and increased aging effects.

SUMMARY OF THE INVENTION

The present invention provides a surface acoustic wave device which has minimal sensitivity to vibration, shock and thermally induced stresses. Stress minimization is achieved by mounting the acoustic substrate on bellows shaped mounting structures that provide multi-directional deflection movement, the mounting structures being in turn affixed to a base. By providing relatively unrestrained motion in three orthogonal directions, and commbinations thereof, differential thermal expansions of base and substrate are permitted without creating excessive stress on the acoustic substrate. Multidirectional shock and vibration isolation is also achieved by the multidirectional flexure provided by the bellows shaped mounting structure.

DESCRIPTION OF THE PREFERRED EMBODIMENTS

Figure 1:
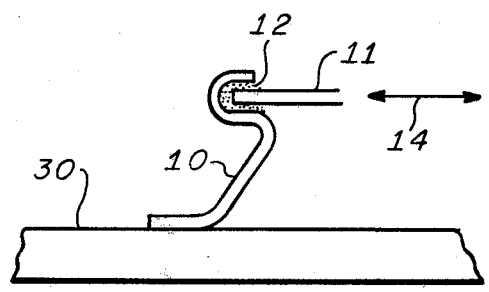
FIGS. 1 and 1A show prior art mounting structures.
Figure 1A:
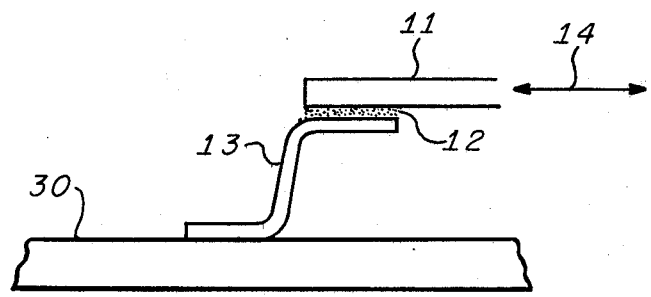
Figure 2:
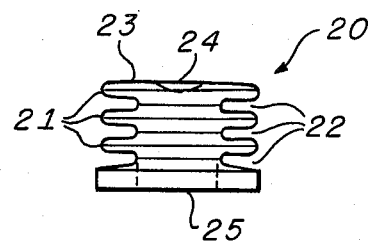
FIG. 2 is a representation of the bellows mounting structure of the present invention.

Referring to FIG. 2, a hollow mounting structure 20 having the shape of a bellows is shown. A thin, flexible, cylinder of material, which may comprise ductile nickel, may be formed having a plurality of folds comprised of alternating ridges 21 and grooves 22. Bellows mount 20 may include a surface 23, which may be relatively flat, or have a dimple 24 as shown in FIG. 2. Bellows 20 may further include an opening 25 to the bellows interior as shown or a flat surface. To prevent oxidation of the surface of the bellows mount, bellows 20 may beneficially be plated with an oxidation resistant material, such as gold, as used in the gold plated bellows contact springs distributed by Servometer Corporation, 501 Little Falls Road, Cedar Grove, N.J. 07009 under Part No. 1571-2.

Although the bellows mount 20 have been described as having a generally cylindrical shape, it will be clear to those skilled in the art, that other shapes, may also be beneficially employed.

Figure 3:
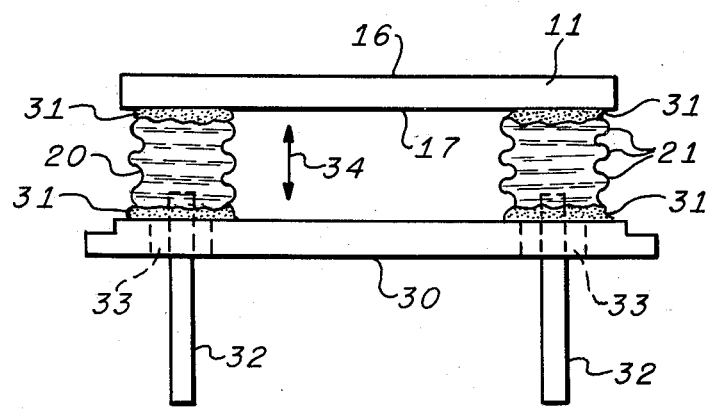
FIGS. 3 and 3A show side and top views, respectively, of the present invention.

Referring to FIG. 3, a surface acoustic wave device may include the bellows mount 20 of FIG. 2 disposed between acoustic substrate 11 and base 20 which may typically be the base of a TO-8 header. Acoustic substrate 11 comprises non-active surface 17 and active surface 16 on which the surface acoustic wave is substantially propagated. Bellows mount 20 may be coupled to non-active surface 17 of acoustic substrate 11 using an adhesive 31 such as epoxy or polyimide resins, or, if non-active surface 17 of substrate 11 has been suitably metallized, solder. Similarly, bellows mount 20 may be coupled to base 30 using adhesive 31, such as epoxy or polyimide or materials such as solder. Additionally, bellows 20 may be affixed to base 30 by press fitting or spot-welding the bellows to pins 32. Pins 32 may be coupled to header base 30 via glass beads 33. Referring again to FIG. 2, dimple 24 provides a well for adhesive 31. Bellows 20, however, may be constructed without dimple 24 providing a flat surface for bonding to non-active surface 17 via adhesive 31.

Figure 3A:
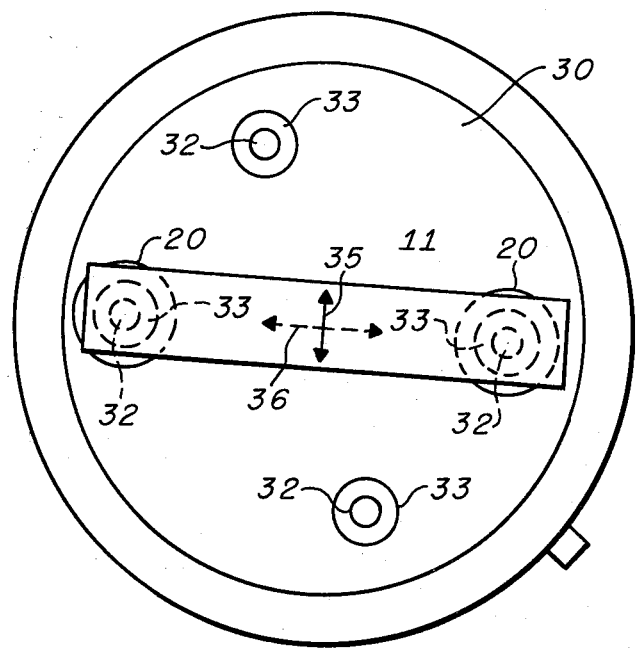

It is well known that a bellows type structure such as bellows 20 in FIGS. 2, 3, and 3A may have substantial flexibility in all directions. Arrows 34 (FIG. 3) and arrows 35 and 36 (FIG. 3A) indicate the three orthogonal directions of motion in which the bellows mount 20 will permit substrate 11 to move without substantial restriction within the limits of the bellows mount compression and extension characteristics, relative to base 30. Thus, relative to base 30, substrate 11 may move in up-down, in-out or side-to-side directions or a combination thereof without producing undue stress due to restrictions on the movement of the acoustic substrate. The bellows mount will in part act as a cushion, or shock absorber and dissipate mechanical energy therein. Furthermore, since the thermal coefficient of expansion of materials, of which substrate 11, for example, quartz, is comprised may differ from the coefficient of thermal expansion of base 30 which may comprise for example, an iron-nickel-cobalt alloy such as that sold under the trademark Kovar, it is necessary to allow for the different thermal expansion characteristics of substrate 11 and base 30. The multidirectional flexures provided by bellows 20, permit base 30 to expand and contract at a different rate and in amounts differing from substrate 11 without producing undesirable strains thereon.

Stressing the acoustic substrate 11 may lead to increased aging effects, manifested in changes in the SAW device's operating characteristics. It is well known in the art that stressing the acoustic substrate will alter the substrate's properties, such as the elastic constants, dielectric constants, piezoelectric constants and consequently the surface acoustic wave velocity. As a result, the devices operating frequency may be undesirably affected. Additionally, microcracks which may be present in the substrate material during fabrication may further propagate throughout the crystal substrate due to strain on the substrate. These microcracks may also change the SAW device characteristics, and possibly lead ultimately to failure of the device.

Active surface 16 is typically completely exposed to the environment within the package, for example a TO-8 package, that the SAW device is mounted within. Gases, and gaseous mixtures including, for example, air may be trapped within such a package. Any contaminants within the package may settle on the active surface 16, resulting in a mass loading of the active surface that alters the frequency characteristics of the SAW device. It is therefore important to minimize contaminants trapped within the SAW package and the formation of such contaminants. Since oxides formed within the SAW package may contaminate active surface 16, it is desirable to fabricate or caot the bellows mount with gold, or similar materials that are not readily oxidized. Similarly, adhesive 31 should be comprised of a low outgassing material, such as metal filled epoxy. Gold filled epoxies which have the additional advantage of being electrically conductive and resistant to oxide formation are particularly suitable.

For certain applications of the SAW device, non-active surface 17 may be metallized to form a ground plane. For such devices, adhesive 21 may be a conductive epoxy, such as gold filled epoxy, which forms an electrical connection between the ground plane and pin 32, providing a convenient method to make an electrical connection to the ground plane.

While the invention has been described in its preferred embodiment, it is to be understood that the words which have been used are words of description rather than limitation and that changes may be made within the purview of the appended claims without departing from the true scope and spirit of the invention in its broader aspects.

I claim:

1. An improved surface acoustic wave device of the type having an acoustic substrate and a base wherein the improvement comprises:
   bellows shaped mounting means disposed between said substrate and said base for providing multidirectional deflection movement;
   first means for attaching said bellows means to said substrate; and
   second means for attaching said bellows means to said base.

2. The device according to claim 1 wherein said bellows mounting material is fabricated from a flexible material.

3. The device according to claim 2 wherein said flexible material comprises ductile nickel.

4. The device according to claim 2 wherein said flexible material is a low outgassing, low oxidization material.

5. The device according to claim 4 wherein said flexible material is gold plated ductile nickel.

6. The device according to claim 1 wherein said first and second attaching means comprises an adhesive.

7. The device according to claim 6 wherein said adhesive comprises epoxy resin.

8. The device according to claim 7 wherein said epoxy resin comprises gold-filled epoxy resin.

9. The device according to claim 6 wherein said adhesive comprises polyimide resin.

10. The device according to claim 1 wherein said second attaching means comprises solder.

11. The device according to claim 1 wherein said second attaching means comprises at least one pin coupled to said base and aligned with the interior of said bellows mounting means.

12. The device according to claim 11 wherein said interior of said bellows mounting means is aligned in friction fit relation to said pin.

13. The device according to claim 11 wherein said pin is spot-welded to said bellows mounting means.

14. The device according to claim 11 further comprising epoxy resin disposed between said pin and said bellows means for providing adhesion therebetween.

* * * * *